United States Patent [19]
Pascente

[11] 4,049,976
[45] Sept. 20, 1977

[54] SOLID-STATE VOLTAGE SWITCHING CIRCUIT

[76] Inventor: Joseph E. Pascente, 71 Regent Drive, Oak Brook, Ill. 60521

[21] Appl. No.: 684,410

[22] Filed: May 7, 1976

[51] Int. Cl.² .......................................... H03K 17/72
[52] U.S. Cl. ........................... 307/252 T; 307/252 N; 307/252 W; 323/18; 323/22 SC; 323/24; 323/39
[58] Field of Search .......... 307/252 C, 252 H, 252 N, 307/252 P, 252 Q, 252 T, 305, 252 R, 252 A, 252 B, 252 D, 252 E, 252 F, 252 G, 252 J, 252 W; 323/22 SC, 24, 18, 39

[56] References Cited

U.S. PATENT DOCUMENTS

| | | | |
|---|---|---|---|
| 3,189,759 | 6/1965 | Laishley | 307/252 J |
| 3,271,700 | 9/1966 | Gutzwiller | 307/255 |
| 3,275,855 | 9/1966 | Wright | 307/252 C |
| 3,287,571 | 11/1966 | White | 307/252 T |
| 3,546,488 | 12/1970 | Motto, Jr. | 307/305 |

FOREIGN PATENT DOCUMENTS 2,260,156  6/1974  Germany .......................... 307/252 C

OTHER PUBLICATIONS

Koranye, T. D., Power Supply Switch, IBM Technical Disclosure Bulletin, vol. 10, No. 8, Jan. 1968, pp. 1138–1139.

Primary Examiner—John Zazworsky
Assistant Examiner—Marcus S. Rasco
Attorney, Agent, or Firm—Gary, Juettner & Pyle

[57] ABSTRACT

A circuit for switching a voltage between a pair of terminals by means of a thyristor, preferably a silicon controlled rectifier (SCR), connected at its anode to one of the terminals and at its cathode to the other terminal, is characterized by a control switch connected with a normally open contact thereof between the gate and the anode of the SCR, and with a normally closed contact controlling the voltage at the gate of the SCR. With the control switch in its normal or "off" condition, the SCR is nonconductive and the voltage at the gate thereof is controlled independently to adjust the voltage at which the SCR would be turned on by a rapidly increasing voltage between the terminals, i.e., to adjust its dv/dt withstand capability. With the switch in its "on" condition, the gate is disconnected from control voltage and connected to the anode of the SCR, thereby to minimize the gate current required to render the SCR conductive.

In one embodiment, the normally closed contact is connected directly between the gate and the cathode of the SCR. In another embodiment, the normally closed contact is connected between the gate and a separately controlled source of biasing voltage.

To switch an a.c. voltage, the circuit may be connected with a full wave rectifier, or a pair of the circuits may be connected between the terminals, each for conducting an opposite half cycle of the a.c. voltage.

17 Claims, 4 Drawing Figures

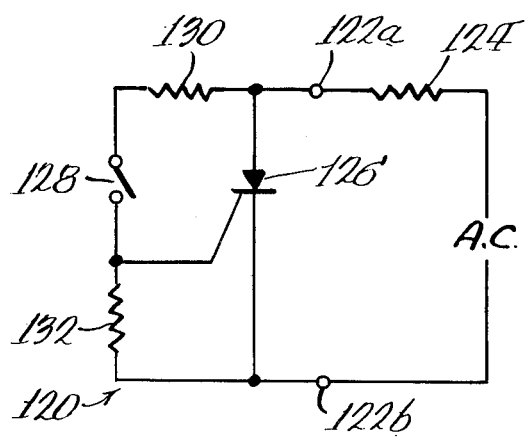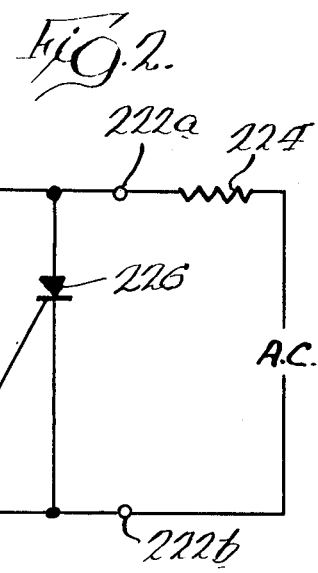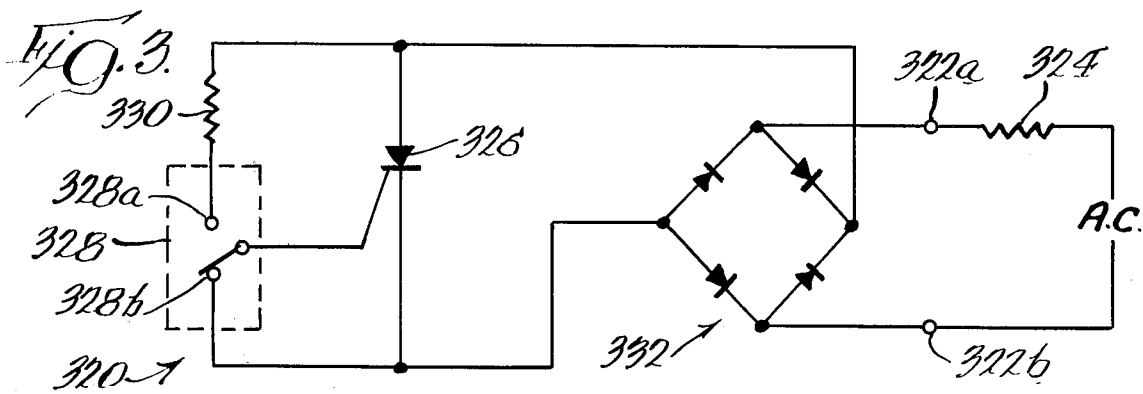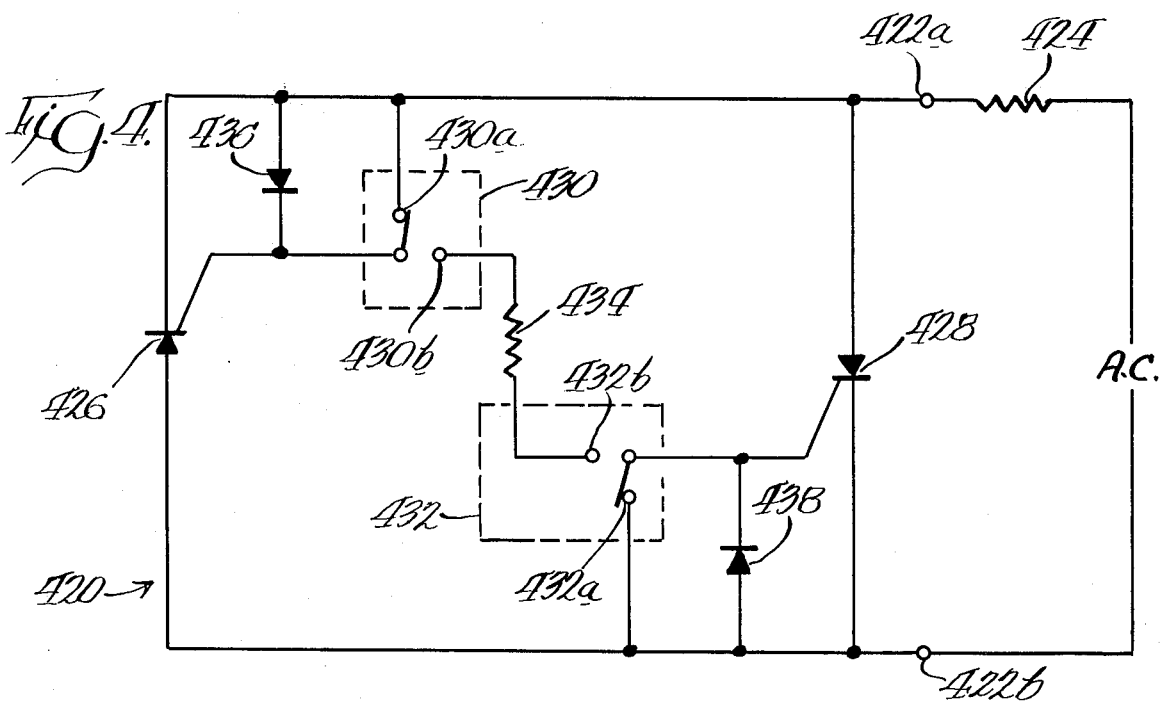

SOLID-STATE VOLTAGE SWITCHING CIRCUIT

BACKGROUND OF THE INVENTION

The present invention relates to solid-state relay voltage switching circuits.

Solid-state relays for switching a.c. or d.c. voltages are often used in applications such as traffic control equipment, motor controls, and the like, and employ thyristor devices to switch the voltage between a pair of terminals. Such relays offer many advantages over their mechanical counterparts. For example, with the solid-state relay there are no moving parts and no contact bounce, the relay is capable of fast operation, is shock and vibration resistant, and does not emit audible noise when operated.

Such relays often use a thyristor, e.g., a silicon controlled rectifier (SCR), connected with its anode-cathode circuit between the terminals, as the voltage conducting device. To operate the relay, a switch such as a reed switch is operated to connect the gate of the SCR to the anode thereof through a resistor to render the SCR conductive and thereby establish a circuit path between the terminals. When the switch is turned "off," the connection between the gate and the anode is removed, and the SCR, if then conducting, becomes non-conductive when the switched voltage passes through its zero-current point. Unfortunately, a disadvanatge of such relays is the ability of a rapidly increasing voltage at the anode of an SCR to switch on the SCR, when it is otherwise in its off state, which can lead to spurious operation of the relay. Generally, the switched voltage is an a.c. line voltage, and if it were a clean sine wave this would present no problem. However, line voltages normally encountered are not clean waves, and superimposed thereon are transient voltage spikes from switches, motors, solenoids, electromechanical relays, lightning, etc. Where the voltage transients have a sufficiently large change of voltage amplitude with respect to time, or $dv/dt$, they can turn on an otherwise off SCR relay.

Conventionally, attempts to prevent spurious operation of SCR relays include connecting RC networks across the anode-cathode circuit of the SCR to integrate, or reduce the $dv/dt$, of voltage transients applied thereacross. One disadvantage of this technique is that the relays then have inherent off state leakages through the RC networks, and the lower the required sensitivity of the relays to voltage transients, the lower the required impedance value of the RC networks, and the greater the leakage currents.

Another known technique, which essentially eliminates the leakage current, takes advantage of the characteristic of an SCR that the less positive the voltage at its gate is with respect to the voltage at its cathode, the greater the $dv/dt$ across its anode and cathode the SCR can withstand without being switched on, or the higher its $dv/dt$ withstand capability. With this in mind, SCRs of the so-called "shorted emitter" configuration, having a partial gate to cathode short built into them, have been used in relays. Alternatively, a resistor may be connected between the gate and the cathode of an SCR to reduce the voltage at its gate toward the voltage at its cathode, and thereby increase the $dv/dt$ withstand capability of the SCR.

Unfortunately, the above technique suffers a serious draw-back consequent upon another inherent characteristic of an SCR; namely, the less positive the voltage at its gate is with respect to that at its cathode, the greater the gate current required to render it conductive. To decrease the gate current required to turn on the SCR, the gate should not be connected to the cathode. This, of course, undesirably decreases the $dv/dt$ withstand capability of the SCR. To increase the $dv/dt$ withstand capability, the voltage at the gate is ideally brought as close as possible to the voltage at the cathode. As noted, this undesirably increases the gate turn on current. Thus, the two are at odds with one another. In the prior art, at compromise was made, i.e., the value of the resistance between the gate and the cathode was selected to provide a "compromise voltage" at the gate, which neither maximized the $dv/dt$ withstand capability of the SCR, nor minimized the gate turn on current thereof. Even where increased gate turn on current can be tolerated, the value of the resistance may be decreased to bring the voltage at the gate of the SCR toward the cathode voltage only to an extent that allows the SCR to be turned on, which gate voltage does not equal that at the cathode and therefore does not fully increase the $dv/dt$ withstand capability of the SCR.

OBJECTS OF THE INVENTION

The primary object of the present invention is to provide a voltage switching circuit of the thyristor, preferably SCR type, wherein the $dv/dt$ withstand capability of the thyristor is maximized, and the gate turn on current of the thyristor is minimized.

Another object of the present invention is to provide a voltage switching circuit of the SCR type, wherein the gate voltage of a nonconductive SCR is controlled independently to adjust the $dv/dt$ withstand capability of the SCR.

SUMMARY OF THE INVENTION

In accordance with the present invention, a voltage switching circuit for receiving a voltage across a pair of terminals and for selectively establishing a circuit path therebetween includes a thyristor having an anode connected to one of the terminals, a cathode connected to the other of the terminals, and a gate, and a switch having two conditions or states, one for connecting the gate to the cathode in a first or "off" state, and the other for connecting the gate to the anode in a second or "on" state. In the first or "off" state the gate is connected only to the cathode and not to the anode, thereby to increase the $dv/dt$ withstand capability of the thyristor. In the second or "on" state, the gate is connected only to the anode and not to the cathode, thereby to decrease the thyristor turn on current.

In a preferred circuit for switching a.c. voltages, a first silicon controlled rectifier (SCR) has its anode connected to one of the terminals and its cathode connected to the other of the terminals, and a second SCR has its anode connected to the other terminal and its cathode connected to the one terminal. A swich means having two states, i.e., "off" and "on," connects the gate of the first SCR to the cathode thereof and the gate of the second SCR to the cathode thereof in the first or "off" state, and connects the gate of the first SCR to the gate of the second SCR in the second or "on" state. A first diode is connected at its anode to the cathode of the first SCR and at its cathode to the gate thereof, and a second diode is connected at its anode to the cathode of the second SCR and at its cathode to the gate thereof.

Consequently, each SCR serves to conduct a respective half cycle of the a.c. voltage when the switch means is "on."

In said preferred embodiment, the switch means preferably comprises first and second reed switches, each associated with a respective SCR and each having first and second alternately closed contacts, with the first contacts connected in series between the gates of the SCRs, and the second contacts connected between the gate and cathode of the respective SCRs, the first contacts being open and the second contacts closed in the first or "off" state to render the SCRs nonconductive and to increase the $dv/dt$ withstand capabilities thereof, and the first contacts being closed and the second contacts open in the second or "on" state to decrease the gate turn on currents of the SCRs and to render the SCRs conductive to establish the circuit path between the terminals.

In another embodiment, the switches when in the "off" state connect the gates of the SCRs to an independently controllable source of biasing potential, whereby the $dv/dt$ withstand capabilities of the SCRs may be selectively adjusted.

Use of the switches in the circuit thus increases the $dv/dt$ withstand capabilities of the SCRs to reduce spurious operation of the circuits caused by the occurrence of transients imposed upon the a.c. voltage, and yet decreases the gate current required to render the SCRs conductive.

The foregoing and other objects, advantages and features of the invention will become apparent from a consideration of the following detailed description, when taken in conjunction with the appended drawings.

BRIEF DESCRIPTION OF THE DRAWINGS

FIG. 1 illustrates a typical, prior art half wave thyristor voltage switching circuit having a resistor connected between the gate and the cathode of an SCR;

FIG. 2 illustrates a half wave voltage switching circuit, having switched connections between the gate and cathode and between the gate and anode of an SCR in accordance with the teachings of the present invention;

FIG. 3 illustrates the circuit of FIG. 2 connected with a full wave bridge for switching full cycles of an a.c. voltage; and FIG. 4 illustrates a preferred embodiment of a voltage switching circuit embodying the teachings of the present invention, having a pair of SCRs connected back to back for switching full cylces of an a.c. voltage.

DETAILED DESCRIPTION

FIG. 1 of the drawings illustrates in simplified, schematic form, a typical prior art switching circuit or relay 120 for switching half cycles of an a.c. voltage between a pair of terminals 122a and 122b to apply the voltage across an external load shown as a resistor 124. Alternatively, the circuit may be for switching a d.c. voltage between the terminals. The circuit includes a silicon controlled rectifier (SCR) 126 connected at its anode to the terminal 122a and at its cathode to the terminal 122b. A normally open switch 128 is connected in series with a resistor 130 between the anode and the gate of the SCR. Closing the switch renders the SCR conductive to half cycles of the voltage between the terminals, whereas opening the switch renders the SCR non-conductive.

In use of the relay, the a.c. voltage is normally line voltage, and superimposed thereon and across the SCR are transient voltages caused by electric motors, solenoids, switches, lightning, and the like, which generally have a relatively high change of amplitude with respect to time, or a high $dv/dt$. The SCR has a finite $dv/dt$ rating, and even though the switch 128 is open, transient line voltages having a $dv/dt$ in excess of this rating can cause the SCR to conduct.

A characteristic of an SCR is that the less positive the voltage at its gate is with respect to the voltage at its cathode, the greater the change in voltage amplitude with respect to time the SCR can withstand between its anode and cathode without being switched on, or the greater its $dv/dt$ withstand capability. Therefore, to increase the resistance of the SCR to being turned on by transient line voltages, the prior art teaches connecting a resistor 132 between the gate and the cathode thereof to reduce the voltage at the gate toward the voltage at the cathode.

Unfortunately, another characteristic of an SCR is that the less positive the voltage at its gate is with respect to that at its cathode, the greater the gate current required to render the SCR conductive. Therefore, while the resistor 132 increases the $dv/dt$ withstand capability of the SCR, it also increases the gate turn on current thereof. Accordingly, the value of the resistor is selected to develop at the gate a "compromise voltage" which neither fully increases the $dv/dt$ withstand capability of the SCR nor fully decreases the gate turn on current thereof.

The present invention for the first time takes advantage of the fact that an SCR exhibits greatly increased $dv/dt$ withstand capability when the gate voltage thereof is exactly equal to or less than the cathode voltage, and that the gate turn on current is greatly decreased when the gate is isolated from the cathode, to provide thyristor solid-state relay voltage switching circuits wherein the gate of an SCR is directly connected to the cathode thereof, or to an independently controllable source of negative biasing potential, when the circuit is off, and wherein the gate connection is removed to isolate the gate from the cathode when the circuit is on.

Referring to FIG. 2, there is shown a voltage switching relay circuit 220 embodying the teachings of the present invention The circuit is similar to the prior art circuit of FIG. 1 to the extent that it includes a pair of terminals 222a and 222b between which an a.c. voltage is switched to be applied across an external load shown as a resistor 224, and a thyristor, shown as an SCR 226, comprises the switching device. As with the circuit of FIG. 1, this circuit may also be for switching a d.c. voltage.

In accordance with the present invention, the control means for the thyristor or SCR 226 comprises a switch 228 having a pair of alternately engaged contacts, namely, a normally open contact 228a connected in series circuit with a resistor 230 between the anode and the gate of the SCR and a normally closed contact 228b connected in series circuit between the cathode and the gate of the SCR. Thus, in the normal or "off" state of the switch, the contact 228b, which offers essentially zero impedance, provides a direct connection between the gate and the cathode of the SCR, and thus maintains the gate and cathode at the same voltage. This greatly increases the $dv/dt$ withstand capability of the SCR to enable the SCR to withstand, without being switched on, higher $dv/dt$ line voltage transients than heretofore feasible. When the switch 228 is operated to its "on" condition or state, the contact 228b is opened and the contact 228a is closed. The gate is then coupled to the anode of the SCR and isolated from the cathode to enable the SCR to conduct with fully decreased, i.e., minimum, gate current. To accomplish the stated objectives, the switch 228 is preferably a single pole double throw, break before make reed switch operated in any manner known to the art.

The switch 228 thus serves the double function of enabling the SCR to exhibit greatly increased $dv/dt$ withstand capability when the relay is off, and to require minimum gate turn on current when the relay is on. With the switch 228 actuated to its on state, the SCR is forward biased and rendered conductive to establish a circuit path between the terminals for the half cycles of the a.c. voltage when the terminal 222a is positive with respect to the terminal 222b.

For switching full cycles of an a.c. voltage, the circuit of either FIG. 3 or FIG. 4 may be employed. FIG. 3 illustrates an embodiment of a voltage swiching circuit 330 embodying the principles of the present invention, for switching full cycles of an a.c. voltage between a pair of terminals 322a and 322b to apply the voltage across an external load shown as a resistor 324. The circuit is identical with that of FIG. 2 to the extent that it includes an SCR 326 having its anode connected to its gate through a series circuit of a normally open contact 328a of a reed switch 328 and a resistor 330, and having its gate connected to its cathode through a normally closed contact 328b of the switch. The circuit also includes a full wave rectifier 332 connected between the relay and the load whereby, when the switch 328 is activated to its on state, the SCR conducts full cycles of the a.c. voltage between the terminals. As shown, the rectifier 332 has a.c. input terminals connected to the a.c. circuit and the load, and d.c. output terminals connected to the switching circuit terminals. When the switching circuit is on, the thyristor or SCR is forward biased and rendered conductive to complete the circuit to the load.

FIG. 4 shows another embodiment of a full wave voltage switching circuit provided in accordance with the invention. The circuit, indicated generally at 420, provides for switching full cycles of an a.c. line voltage between a pair of terminals 422a and 422b to apply the voltage across an external load shown as a resistor 424. In this circuit, a pair of SCRs 426 and 428 are connected between the terminals, each for conducting an opposite half cycle of the a.c. voltage. The gate of the SCR 426 is connected to the cathode thereof through a normally closed contact 430a of a reed switch 430, and the gate of the SCR 428 is similarly connected to the cathode thereof through a normally closed contact 432a of a reed switch 432. Normally open contacts 430b and 432b of the switches are connected in series with each other and with a resistor 434 between the gates of the SCRs. A diode 436 is connected at its cathode to the gate of the SCR 426 and at its anode to the cathode thereof, and a diode 438 is connected at its cathode to the gate of the SCR 428 and at its anode to the cathode thereof.

With the switches in their off state, the normally open contacts maintain the SCRs nonconductive, and each normally closed contact directly couples the gate of the associated SCR to the cathode thereof, thereby to increase the SCRs' $dv/dt$ withstand capabilities to transient line voltages. To turn the circuit on, the switches are simultaneously actuated to break the gate to cathode connections and to couple the gates of the SCRs through the resistor 434 and the diodes 436 and 438 to line voltage, whereby the SCRs are rendered conductive to establish circuit paths between the terminals. The diodes limit the reverse voltage applied to the gates of the SCRs when the switches operate at other than zero line voltage, to prevent application of a voltage in excess of the reverse voltage rating to the gate of the SCR not then turning on.

If desired, for any SCR in the circuits shown the $dv/dt$ withstand capability thereof may be even further increased by connecting a diode in series between the cathode thereof and the output terminal otherwise connected therewith. With the anode of the diode connected to the cathode of the SCR and the cathode of the diode connected to the output terminal, the forward voltage drop across the diode is connected through the normally closed switch contact across the cathode-base of the SCR. This further increases the voltage at the cathode of the SCR with respect to that at the base, and thus even further increases the $dv/dt$ withstand capability of the SCR. Then, when the switch is operated to its on state, the normally closed contact opens and the gate is connected only to the anode of the SCR, whereby the gate turn on current is minimized.

Alternatively, if it is desired to operate the SCR with a decreased $dv/dt$ withstand capability, and yet with minimum gate turn on current, a resistor may be connected in series between the normally closed switch contact and the connection of the cathode of the SCR to the output terminal. In this case, when the switch is in its off state, the gate of the SCR is connected to the cathode thereof through the normally closed contact and the resistor. Then, when the switch is in its on state, the gate is disconnected from the cathode and connected only to the anode, whereby the SCR requires minimum gate turn on current.

To selectively control the $dv/dt$ withstand capability of the SCR, in another embodiment of the invention the gate of the SCR is connected through the normally closed switch contact to an adjustable source of reference potential, rather than to the cathode of the SCR. This allows the voltage at the gate of the SCR to be controlled independently of the voltage at the cathode, and if desired the voltage at the gate may be significantly decreased with respect to that at the cathode to significantly increase the $dv/dt$ withstand capability of the SCR.

The invention thus provides thyristor solid-state relay voltage switching circuits, which, as a consequent of the switch means therein, exhibit greatly increased or controllable $dt/dt$ withstand capability against transient line voltages when off, and require minimum gate turn on current when on.

While particular embodiments of the invention have been illustrated and described, it is to be understood that various other modifications and embodiments thereof could be devised by one skilled in the art without departing from the spirit and the scope of the invention, as defined by the appended claims

What is claimed is:

1. In a voltage switching circuit for receiving a voltage across a pair of terminals and having a thyristor for selectively establishing a circuit path therebetween, said thyristor having an anode connected to one of said terminals, a cathode connected to the other of said terminals and a gate, including switch means actuable between two states for directly connecting and short circuiting said gate to said cathode and isolating said gate from said anode in a first state to render said thyristor nonconductive and for connecting said gate to said anode and isolating said gate from said cathode in a second state to render said thyristor conductive, whereby said thyristor requires a decreased gate turn on current to be rendered conductive and when conductive establishes said circuit path, and when nonconductive interrupts said circuit path and has an increased $dv/dt$ withstand capability.

2. In a voltage switching circuit as set forth in claim 1, said switch means being actuable only between said two states and including a first contact connected between said gate and said anode and a second contact connected between said gate and said cathode, said first contact being open and said second contact being closed in said first state to directly connect and short circuit said gate to said cathode to render said thyristor nonconductive and to increase the $dv/dt$ withstand capability thereof, said first contact being closed and said second contact being open in said second state to render said thyristor conductive to establish said circuit path and to decrease the gate turn on current thereof.

3. In a voltage switching circuit as set forth in claim 2, said switch means comprising a single pole, double throw, break before make switch.

4. In a voltage switching circuit as set forth in claim 1, full wave rectifier means having a pair of a.c. voltage input terminals and a pair of d.c. voltage output terminals connected between said switching circuit terminals, said thyristor being connected between said switching circuit terminals to be forward biased.

5. In a voltage switching circuit as set forth in claim 4, said thyristor comprising a silicon controlled rectifier (SCR), said switch means including a first contact connected between said gate and said anode and a second contact connected between said gate and said cathode, said first contact being open and said second contact being closed in said first state to directly connect and short circuit said gate to said cathode to render said SCR nonconductive and to increase the $dv/dt$ withstand capability thereof, said first contact being closed and said second contact being open in said second state to isolate said gate from said cathode, to render said SCR conductive to establish said circuit path and to decrease the gate turn on current thereof, and a resistor in series circuit with said first contact between said gate and said anode.

6. In a voltage switch circuit for receiving an a.c. voltage across a pair of terminals thereof and having a pair of thyristors for selectively establishing a circuit path therebetween, a first one of said thyristors having an anode connected to one of said terminals, a cathode connected to the other of said terminals, and a gate, and a second one of said thyristors having an anode connected to said other terminal, a cathode connected to said one terminal, and a gate, including switch means actuable between two states, for directly connecting and short circuiting said gate of said first thyristor to said cathode thereof and said gate of said second thyristor to said cathode thereof in the first state to render said thyristors nonconductive, and for connecting said gate of said first thyristor to said gate of said second thyristor in the second state to render said thyristors conductive, said switch means in said second state isolating the gates of said thyristors from the cathodes thereof, whereby said thyristors require decreased gate turn on currents to be rendered conductive and when conductive establish said circuit path, and when nonconductive interrupt said circuit path and have increased $dv/dt$ withstand capabilities.

7. In a voltage switching circuit as set forth in claim 6, said switch means in said first state isolating the gates from one another and the anodes of said thyristors.

8. In a voltage switching circuit as set forth in claim 6, said switch means including first and second switches each having first and second contacts, said first contacts connected in series between said gates, said second contact of said first switch connected between said gate and said cathode of said first thyristor, said second contact of said second switch connected between said gate and said cathode of said second thyristor, said first contacts being open and said second contacts being closed in said first state to render said thyristor nonconductive and to increase the $dv/dt$ withstand capabilities thereof, said first contacts being closed and said second contacts being open in said second state to decrease the gate turn on currents of said thyristors and to render the same conductive to establish said circuit path.

9. In a voltage switching circuit as set forth in claim 8, said thyristors comprising silicon controlled rectifiers (SCRs).

10. In a voltage switching circuit as set forth in claim 9, a first diode connected at its anode to said cathode of said first SCR and at its cathode to said gate thereof; and a second diode connected at its anode to said cathode of said second SCR and at its cathode to said gate thereof.

11. In a voltage switching circuit as set forth in claim 8, said switches comprising single pole, double throw, make before break switches.

12. A solid-state relay for receiving a voltage across a pair of terminals and having a silicon controlled rectifier (SCR) for selectively establishing a circuit path therebetween, said SCR having an anode connectable to one of said terminals, a cathode connectable to the other of said terminals, and a gate, including switch means having alternately operable contacts for selectively turning the circuit on and off, said switch means including a first contact connected between said gate and said anode and a second contact connected between said gate and said cathode; said first contact being open and said second contact being closed whenever said switch means is turned off for directly connecting and short circuiting said gate to said cathode and for isolating said gate from said anode, thereby to render said SCR nonconductive and to increase the $dv/dt$ withstand capability thereof; said first contact being closed and said second contact being open whenever said switch means is turned on for connecting said gate to said anode and for isolating said gate from said cathode, whereby said SCR requires a decreased gate turn on current to be rendered conductive and is rendered conductive to establish said circuit path.

13. In a voltage switching circuit for receiving a voltage across a pair of terminals and having a thyristor for selectively establishing a circuit path therebetween, said thyristor having an anode connected to one of said terminals, a cathode connected to the other of said terminals, and a gate, including a source of reference potential; and switch means actuable between two states for directly connecting and short circuiting said gate to said source of reference potential and isolating said gate from said anode in a first state to render said thyristor nonconductive and for connecting said gate to said anode and isolating said gate from said source of reference potential in a second state to render said thyristor conductive, whereby said thyristor requires a decreased gate turn on current to be rendered conductive and when conductive establishes said circuit path, and when nonconductive interrupts said circuit path and has a $dv/dt$ withstand capability in accordance with the value of said reference potential.

14. In a voltage switching circuit as set forth in claim 13, said thyristor comprising a silicon controlled rectifier.

15. In a voltage switching circuit for receiving a voltage across a pair of terminals and having a silicon controlled rectifier for selectively establishing a circuit path therebetween, said silicon controlled rectifier having an anode connected to one of said terminals, a cathode connected to the other of said terminals, and a gate, including a source of reference potential; and switch means actuable between two states, said switch means including a first contact connected between said gate and said anode and a second contact connected between said gate and said source of reference potential, said first contact being open and said second contact being closed in said first state to render said silicon controlled rectifier nonconductive and to control the $dv/dt$ withstand capability thereof, said first contact being closed and said second contact being open in said second state to isolate said gate from said source of reference potential and to render said silicon controlled rectifier conductive to establish said circuit path, whereby said silicon controlled rectifier requires a decreased gate turn on current to be rendered conductive and when conductive establishes said circuit path, and when nonconductive interrupts said circuit path and has a $dv/dt$ withstand capability in accordance with the value of said reference potential.

16. In a voltage switching circuit as set forth in claim 15, further including full wave rectifier means having a pair of a.c. voltage input terminals and a pair of d.c. voltage output terminals connected between said switching circuit terminals, said silicon controlled rectifier being connected between said switching circuit terminals to be forward biased.

17. In a voltage switching circuit for receiving an a.c. voltage across a pair of terminals thereof and having a pair of silicon controlled rectifiers (SCRs) for selectively establishing a circuit path therebetween, a first one of said SCRs having an anode connected to one of said terminals, a cathode connected to the other of said terminals, and a gate, and a second one of said SCRs having an anode connected to said other terminal, a cathode connected to said one terminal, and a gate, including first and second sources of reference potential; switch means actuable between two states, said switch means including first and second switches each having first and second contacts, said first contacts connected in series between said gates, said second contact of said first switch connected between said gate of said first SCR and said first source of reference potential, said second contact of said second switch connected between said gate of said second SCR and said second source of reference potential, said first contacts being open and said second contacts being closed in a first state to render said thyristor nonconductive and to control the $dv/dt$ withstand capabilities thereof in accordance with the potential values of said sources of potential, said first contacts being closed and said second contacts being open in a second state whereby said SCRs require decreased gate turn on current to be rendered conductive and are rendered conductive to establish said circuit path; a first diode connected at its anode to said cathode of said first SCR and at its cathode to said gate thereof; and a second diode connected at its anode to said cathode of said second SCR and at its cathode to said gate thereof.

* * * * *